(12) United States Patent
Manassen et al.

(10) Patent No.: US 12,165,930 B2
(45) Date of Patent: Dec. 10, 2024

(54) ADAPTIVE MODELING MISREGISTRATION MEASUREMENT SYSTEM AND METHOD

(71) Applicant: KLA Corporation, Milpitas, CA (US)

(72) Inventors: Amnon Manassen, Haifa (IL); Vladimir Levinski, Midal Ha'emek (IL); Daria Negri, Haifa (IL); Nireekshan K. Reddy, Tel Aviv (IL)

(73) Assignee: KLA Corporation, Milpitas, CA (US)

( * ) Notice: Subject to any disclaimer, the term of this patent is extended or adjusted under 35 U.S.C. 154(b) by 322 days.

(21) Appl. No.: 17/705,077

(22) Filed: Mar. 25, 2022

(65) Prior Publication Data

US 2022/0392809 A1 Dec. 8, 2022

Related U.S. Application Data

(60) Provisional application No. 63/196,243, filed on Jun. 3, 2021.

(51) Int. Cl.
*H01L 21/66* (2006.01)
*G06F 16/215* (2019.01)
*G06F 18/2135* (2023.01)

(52) U.S. Cl.
CPC .......... *H01L 22/10* (2013.01); *G06F 16/215* (2019.01); *G06F 18/2135* (2023.01)

(58) Field of Classification Search
CPC ... G06F 16/215; G06F 18/2135; H01L 22/10; H01L 22/20
See application file for complete search history.

(56) References Cited

U.S. PATENT DOCUMENTS 10,024,654 B2 * 7/2018 Smith ................ G01B 11/2441
10,964,566 B2 * 3/2021 Lin .................... H01L 21/67259
(Continued)

FOREIGN PATENT DOCUMENTS

WO 2020197571 A1 10/2020
WO 2020263391 A1 12/2020

OTHER PUBLICATIONS

Klein et al., "Error modeling and accuracy breakdown in optical overlay metrology for advanced nodes," Proc. SPIE Advanced Lithography, Optical Microlithography XXXIV, Feb. 22, 2021, vol. 11613, 116130X.
(Continued)

*Primary Examiner* — Vincent H Tran
(74) *Attorney, Agent, or Firm* — Hodgson Russ LLP

(57) ABSTRACT

An adaptive modeling method for generating misregistration data for a semiconductor device wafer (SDW) including calculating a fitting function for a group of SDWs (GSDW) having units, including measuring an SDW in said GSDW, thereby generating test data sets corresponding to the units, removing non-unit-specific values (NUSVs) from the test data sets, thereby generating cleaned test data sets, and analyzing the cleaned test data sets, thereby generating the fitting function, and generating misregistration data for at least one additional SDW (ASDW) in the GSDW, including measuring the ASDW, thereby generating run data sets, removing NUSVs from the run data sets, thereby generating cleaned run data sets, fitting each of the cleaned run data sets to the fitting function, thereby generating coefficient sets, and calculating misregistration data for the ASDW, at least partially based on the fitting function and the coefficient sets.

22 Claims, 4 Drawing Sheets

(56) References Cited

U.S. PATENT DOCUMENTS

| | | | |
|---|---|---|---|
| 2009/0033353 A1* | 2/2009 | Yu | H01L 22/14 |
| | | | 257/E23.141 |
| 2015/0033201 A1* | 1/2015 | Vaid | H01L 22/12 |
| | | | 716/135 |
| 2016/0005590 A1* | 1/2016 | Park | G03F 7/70633 |
| | | | 700/114 |
| 2016/0351455 A1* | 12/2016 | Jung | H01L 22/12 |
| 2017/0286586 A1* | 10/2017 | Kathiresan | G03F 7/70633 |
| 2017/0309525 A1 | 10/2017 | Suzuki et al. | |
| 2020/0018709 A1* | 1/2020 | Hosler | H01L 21/67259 |
| 2020/0124984 A1* | 4/2020 | Chang | G03F 7/70633 |
| 2020/0286794 A1* | 9/2020 | Volkovich | H01L 21/67288 |
| 2020/0333774 A1 | 10/2020 | Banna | |
| 2021/0020480 A1 | 1/2021 | Levinski et al. | |
| 2021/0066139 A1* | 3/2021 | Ho | H01L 21/6715 |
| 2021/0200104 A1* | 7/2021 | Negri | H01L 22/20 |
| 2022/0128908 A1* | 4/2022 | Larranaga | G03F 7/705 |
| 2022/0269184 A1* | 8/2022 | Lin | G03F 7/70633 |
| 2022/0344218 A1 | 10/2022 | Yerushalmi et al. | |

OTHER PUBLICATIONS

Ophir et al., "Machine learning for Tool Induced Shift (TIS) reduction: an HVM case study," Proc. SPIE Advanced Lithography, Metrology, Inspection, and Process Control for Semiconductor Manufacturing XXXV, Feb. 22, 2021, vol. 11611, 116110E.
WIPO, ISR for International Application No. PCT/US2022/025255, Aug. 9, 2022.

\* cited by examiner

ADAPTIVE MODELING MISREGISTRATION MEASUREMENT SYSTEM AND METHOD

REFERENCE TO RELATED APPLICATIONS

Reference is hereby made to U.S. Provisional Patent Application Ser. No. 63/196,243, filed Jun. 3, 2021 and entitled ADAPTIVE MODELING, the disclosure of which is hereby incorporated by reference and priority of which is hereby claimed.

Reference is also made to the following patent application of the Applicant, which is related to the subject matter of the present application, the disclosure of which is hereby incorporated by reference:

U.S. patent application Ser. No. 17/469,280, filed Sep. 8, 2021, and entitled SYSTEMS AND METHODS FOR IMPROVED METROLOGY FOR SEMICONDUCTOR DEVICE WAFERS.

FIELD OF THE INVENTION

The present invention relates to measurement of misregistration in the manufacture of semiconductor devices generally.

BACKGROUND OF THE INVENTION

Various methods and systems are known for measurement of misregistration in the manufacture of semiconductor devices.

SUMMARY OF THE INVENTION

The present invention seeks to provide improved methods and systems for measurement of misregistration in the manufacture of semiconductor devices.

There is thus provided in accordance with an embodiment of the present invention an adaptive modeling method for generating misregistration data between at least two layers formed on a semiconductor device wafer (SDW), the method comprising calculating a fitting function for a group of SDWs (GSDW), the GSDW comprising a plurality of units, the calculating the fitting function comprising measuring a plurality of measurement sites on at least one SDW in the GSDW, thereby generating a plurality of test data sets, each of the test data sets corresponding to at least one of the units, removing non-unit-specific values (NUSVs) from each of the plurality of test data sets, thereby generating a corresponding plurality of cleaned test data sets, and analyzing the cleaned test data sets, thereby generating the fitting function for the GSDW, and generating misregistration data for at least one additional SDW (ASDW) in the GSDW, the generating misregistration data including measuring a plurality of measurement sites on the ASDW, thereby generating a plurality of run data sets, the run data sets corresponding to the test data sets, removing NUSVs from each of the plurality of run data sets, thereby generating a corresponding plurality of cleaned run data sets, fitting each of the cleaned run data sets to the fitting function, thereby generating a plurality of coefficient sets corresponding to the plurality of cleaned run data sets, and calculating misregistration data for the ASDW, at least partially based on the fitting function and the plurality of coefficient sets.

In accordance with an embodiment of the present invention, the analyzing the cleaned test data sets includes performing principal component analysis (PCA) on the plurality of cleaned test data sets.

In accordance with an embodiment of the present invention, each of the units includes a single field on the SDW. The NUSVs can be wafer terms.

Alternatively, in accordance with an embodiment of the present invention, each of the units includes a multiplicity of fields on the SDW. The NUSVs can be field terms.

In accordance with an embodiment of the present invention, the misregistration data includes tool-induced-shift (TIS) values. Alternatively, in accordance with an embodiment of the present invention, the misregistration data includes misregistration values.

In accordance with an embodiment of the present invention, the NUSVs are modeled NUSVs.

In accordance with an embodiment of the present invention, the method also includes correlating the misregistration data with at least one tool used in a manufacture of the GSDW. The method also can include correlating the misregistration data with at least one additional tool used in the manufacture of the GSDW.

In an instance, the calculating misregistration data for the ASDW includes transforming the plurality of coefficient sets, thereby generating a plurality of transformed coefficient sets. In accordance with an embodiment of the present invention, the plurality of transformed coefficient sets correspond to a model other than the fitting function. In an instance, the model includes one of a lithography scanner model, a deposition model, an etcher model, a polisher model and a misregistration metrology tool model.

There is also provided in accordance with another embodiment of the present invention an adaptive modeling system for generating misregistration data between at least two layers formed on a semiconductor device wafer (SDW), the system including one or more fabrication tools used in a manufacture of at least two layers formed on an SDW, each SDW being part of a group of SDWs (GSDW), the GSDW including a plurality of units, a metrology tool, used to measure a plurality of measurement sites on at least one SDW in the GSDW, thereby generating a plurality of test data sets, each of the test data sets corresponding to at least one of the units, and an analysis engine operative to calculate a fitting function the GSDW, the calculating the fitting function including removing non-unit-specific values (NUSVs) from each of the plurality of test data sets, thereby generating a corresponding plurality of cleaned test data sets, and analyzing the cleaned test data sets, thereby generating the fitting function for the GSDW.

In an instance, the metrology tool also measures a plurality of measurement sites on the ASDW, thereby generating a plurality of run data sets, the run data sets corresponding to the test data sets, and the analysis engine is further operative to generate misregistration data for at least one additional SDW (ASDW) in the GSDW, the generating misregistration data including removing NUSVs from each of the plurality of run data sets, thereby generating a corresponding plurality of cleaned run data sets, fitting each of the cleaned run data sets to the fitting function, thereby generating a plurality of coefficient sets corresponding to the plurality of cleaned run data sets, and calculating misregistration data for the ASDW, at least partially based on the fitting function and the plurality of coefficient sets.

In accordance with another embodiment of the present invention, the multiplicity of fabrication tools includes at least one of a lithography scanner tool, a deposition tool, an etcher tool and a polisher tool.

In an instance, the metrology tool includes a misregistration metrology tool. In accordance with another embodiment of the present invention, the misregistration metrology tool includes an electron-beam misregistration metrology tool. Alternatively, in accordance with another embodiment of the present invention, the misregistration metrology tool includes an imaging misregistration metrology tool. Alternatively in accordance with another embodiment of the present invention, the misregistration metrology tool includes a scatterometry misregistration metrology tool.

In accordance with an embodiment of the present invention, the analysis engine also correlates the misregistration data with at least one of the one or more fabrication tools and the metrology tool. In an instance, the analysis engine also correlates the misregistration data with at least one additional one of the one or more fabrication tools and the metrology tool.

BRIEF DESCRIPTION OF THE DRAWINGS

The present invention will be understood and appreciated more fully from the following detailed description, taken in conjunction with the drawings in which.

DETAILED DESCRIPTION OF EMBODIMENTS

Figure 1A:
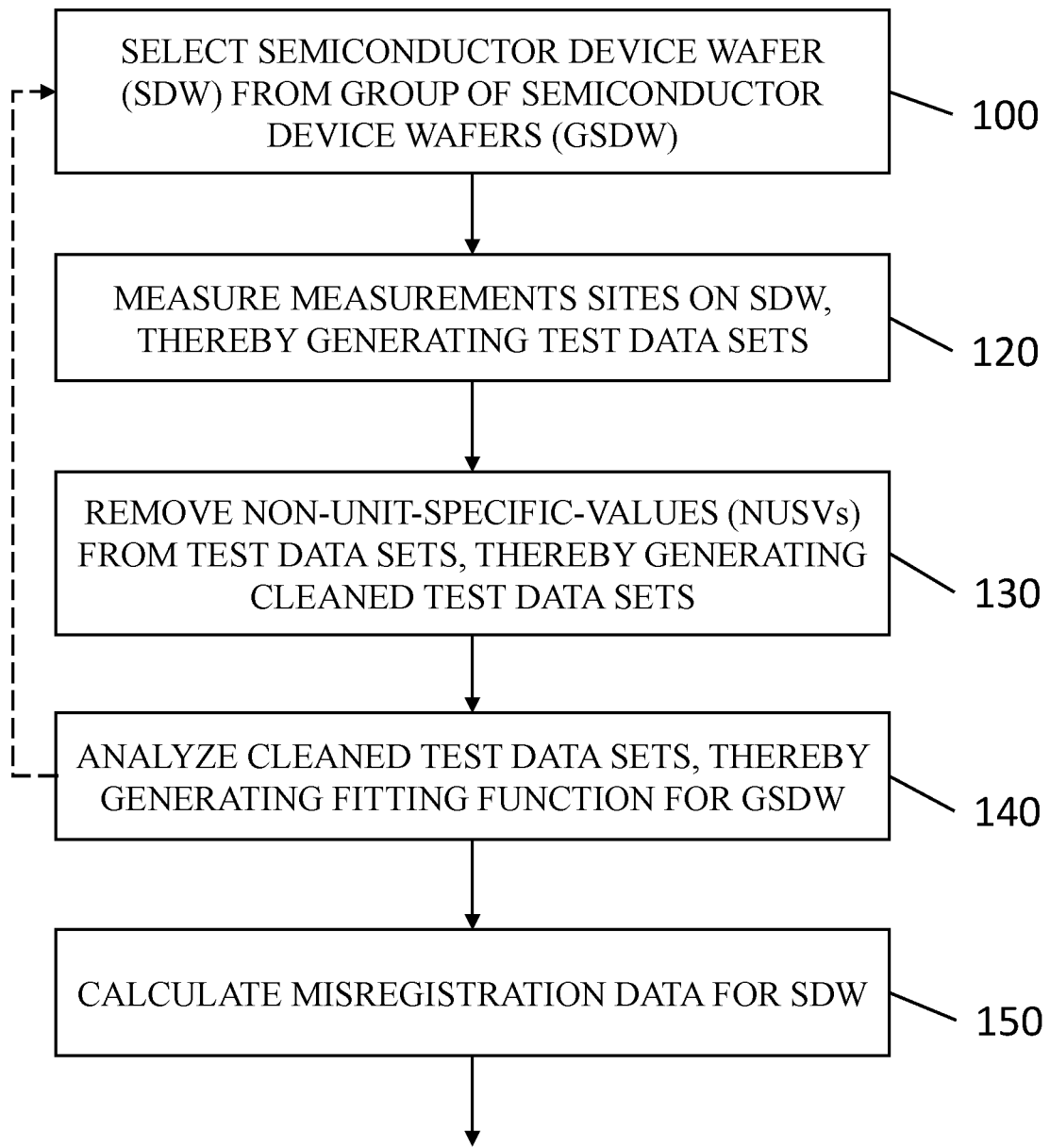
FIGS. 1A & 1B are together a simplified flow chart illustrating an adaptive modeling method for generating misregistration data between at least two layers formed on a semiconductor device wafer (SDW)

It is appreciated that the system and method described hereinbelow with reference to FIGS. 1A-3 can be used to measure misregistration between layers formed on a wafer on which semiconductor devices are formed and are part of a manufacturing process for semiconductor devices. The misregistration measured by the system and method described hereinbelow with reference to FIGS. 1A-3 can be used to adjust fabrication processes, such as, inter alia, lithography, deposition, etching and/or polishing during the manufacture of the semiconductor devices to ameliorate misregistration between various layers formed on the semiconductor devices being fabricated.

In an embodiment of the present invention, the method and system disclosed hereinbelow with reference to FIGS. 1A-3 provide misregistration data for multiple semiconductor device wafers (SDWs) in a group of semiconductor device wafers (GSDW). The GSDW may be any suitable group of SDWs, such as, inter alia, a batch of SDWs, a lot of SDWs or a run of SDWs. It is appreciated that various ones of SDWs in the GSDW may be fabricated in series with one another or in parallel with one another. In an instance, each SDW in the GSDW is fabricated using the same fabrication tools as are used to fabricate each of the other SDWs in the GSDW; however, some or all SDWs in the GSDW may be fabricated using different fabrication tools as are used to fabricate some or all of the other SDWs in the GSDW.

In one embodiment of the present invention, each of the SDWs in the GSDW undergoes the same fabrication steps and includes semiconductor devices which are intended to be identical to corresponding semiconductor devices on all other of the SDWs in the GSDW. In another embodiment of the present invention, at least one of the SDWs in the GSDW is intentionally fabricated differently than others of the SDWs in the GSDW, typically as a design of experiment (DOE) wafer, which is fabricated using parameters that intentionally vary from others of the SDWs in the GSDW.

Typically, production runs of semiconductor devices include multiple units intended to be identical to one another, each unit typically further includes sub-units intended to be identical to one another, and each sub-unit yet further includes sub-sub-units intended to be identical to one another, etc. For example, a GSDW generally includes many SDWs, each intended to be identical to one another; each SDW generally includes many columns of dies, each intended to be identical to one another; each column of dies includes many dies, each intended to be identical to one another; each die includes many fields, many or all of which are intended to be identical to one another; and each field includes many features, many or all of which are intended to be identical to one another.

Since SDWs typically include multiple units intended to be identical to one another, misregistration between layers in a particular unit can advantageously be analyzed with respect to misregistration between layers in other units intended to be identical to the particular unit. For example, if many fields in an SDW are intended to be identical to one another, then misregistration within each of the various fields typically exhibits similar characteristics to that of misregistration within each of the other fields. Similarly, if many SDWs are intended to be identical to one another, then misregistration in each of the various SDWs typically exhibits similar characteristics to that of misregistration within each of the other SDWs.

However, comparing misregistration between two or more corresponding layers of different units or sub-units is complex. This complexity is partially due to the fact that misregistration measurement signals typically include contributions from multiple sources. For example, a single misregistration measurement signal may include contributions from both an SDW and a field. These multiple contributions to a single misregistration measurement signal cause the correlation of misregistration data between corresponding units of a GSDW to be non-trivial.

In the methods and systems of the present invention, misregistration data from a unit or sub-unit are identified from a general signal, and terms not due to that unit or sub-unit are discarded. This separation of misregistration data into unit-specific and non-unit-specific portions advantageously generates misregistration data having relatively high accuracy and relatively high meaning as compared to systems and methods of prior art. Additionally, the methods and systems of the present invention have relatively low computing costs, in both time and computing power required, as compared to systems and methods of prior art.

In one embodiment of the present invention, the data with relatively high meaning generated by the method and system of the present invention includes misregistration data that describes the effects of one or more specific tools used in the fabrication of an SDW. In another embodiment of the present invention, the data with relatively high meaning generated by the method and system of the present invention includes misregistration data that describes separately misregistration due to acquisition errors of a scanner fabrication tool and aberration errors of a scanner fabrication tool. Additionally, the data with relatively high meaning generated by the method and system of the present invention may include misregistration data that describes separately misregistration due to aberrations and to focus error.

Therefore, the systems and methods of the present invention potentially offer relatively low throughput costs, both in terms of time and computing power required for measurement and analysis, and in terms of space on SDWs to be set aside for dedicated measurement devices, such as dedicated misregistration measurement targets.

Figure 1B:
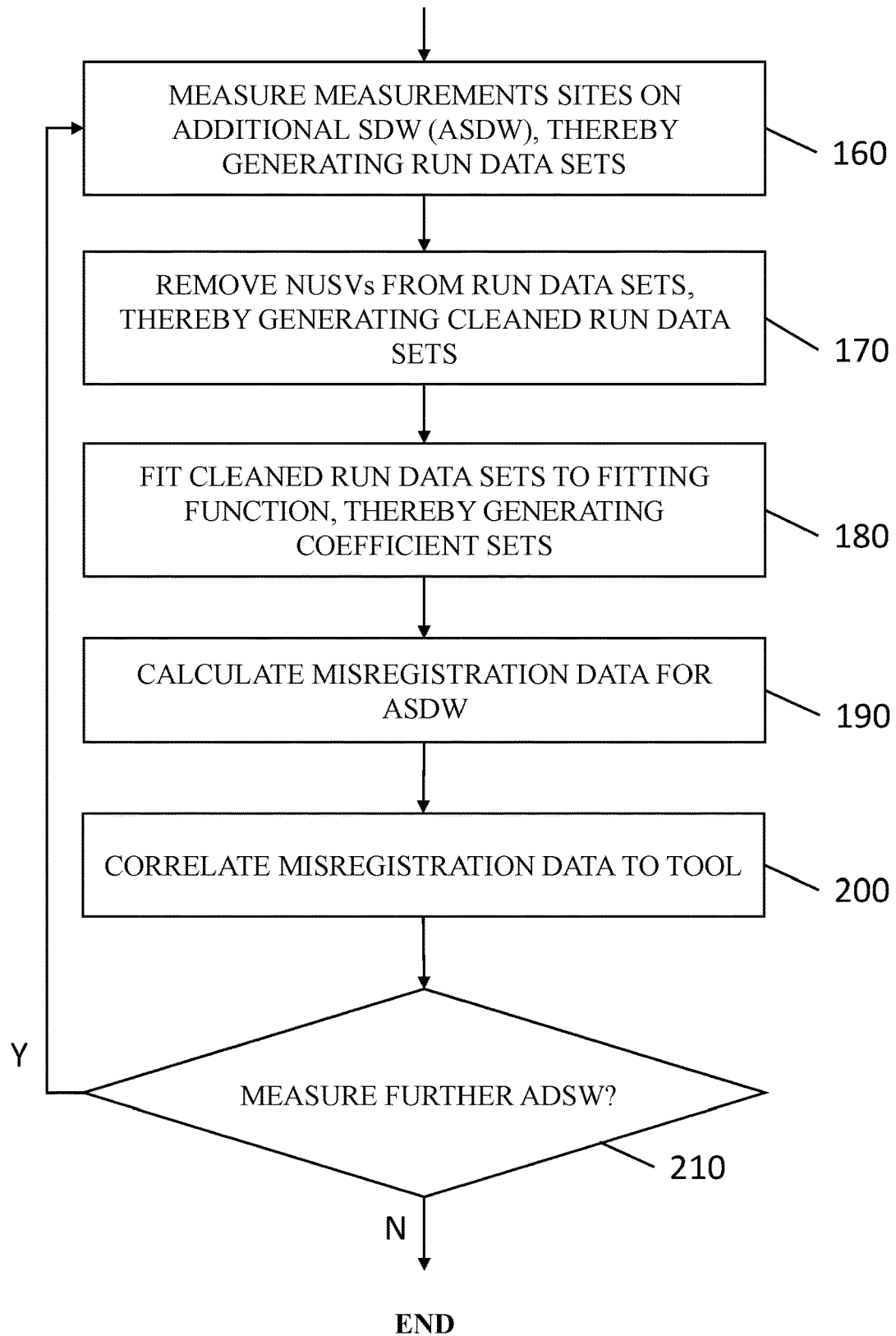
Figure 2A:
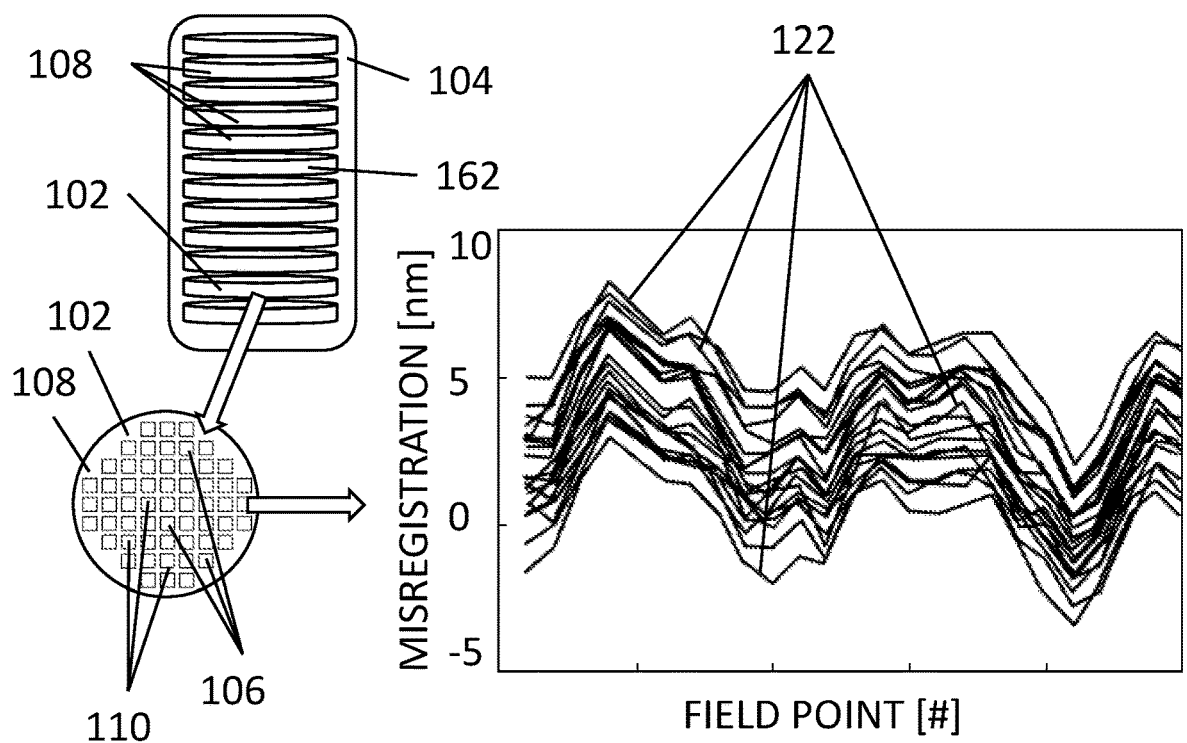
FIGS. 2A and 2B are each a simplified representation of a portion of the method of FIGS. 1A & 1B.
Figure 2B:
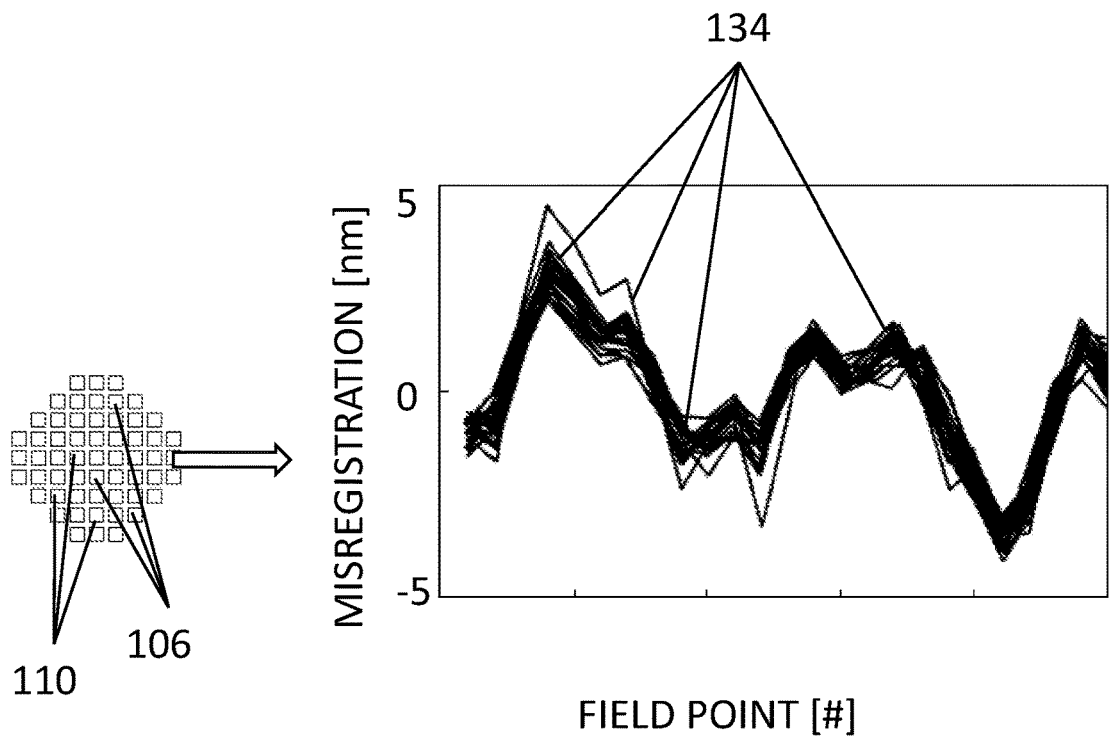

Reference is now made to FIGS. 1A & 1B, which are together a simplified flow chart illustrating an adaptive modeling method for generating misregistration data between at least two layers formed on a semiconductor device wafer (SDW), and to FIGS. 2A & 2B, which are each a simplified representation of a portion of the method of FIGS. 1A & 1B. It is noted that the method of FIGS. 1A-2B includes calculating a fitting function for a group of SDWs (GSDW), as seen generally in FIGS. 1A, 2A & 2B, and generating misregistration data for at least one additional SDW (ASDW) in the GSDW, as seen generally in FIG. 1B.

As seen in a first step 100 in FIG. 1A, the method begins with a selection an SDW 102 from a GSDW 104. As described hereinabove, and as seen in FIGS. 2A & 2B, GSDW 104 includes a multiplicity of units 106, which may be embodied as any suitable component of SDW 102 or GSDW 104, such as, inter alia, a plurality of SDWs 108, a plurality of fields 110, a plurality of dies, a plurality of rows, a plurality of columns or a plurality of chips. GSDW 104 can include at least 50 units 106, and typically includes more than 50 units 106, such as, for example, hundreds of units 106 or thousands of units 106.

At a next step 120, a plurality of measurement sites on SDW 102 are measured, thereby generating a plurality of test data sets 122. In an instance, each test data set 122 corresponds to one unit 106. Thus, the number of test data sets 122 generated at step 120 is typically the same as the number of units 106. For simplicity and ease of understanding, only a relatively few test data sets 122 are shown in FIG. 2A. Additionally, test data sets 122 typically include data in two dimensions; however, for simplicity and ease of understanding, test data sets 122 are shown for one dimension only.

At a next step 130, non-unit-specific values (NUSVs) are identified and removed from each test data set 122 generated at step 120, thereby generating a plurality of cleaned test data sets 134 corresponding to plurality of test data sets 122. In an instance, all or nearly all data included in cleaned test data sets 134 is characteristic only of unit 106.

Thus, in an embodiment wherein each unit 106 is a field 110, all or nearly all data in each cleaned test data set 134 is due to the field 110 corresponding to cleaned test data set 134, but not due to SDW 102. In such an embodiment, the NUSVs of step 130 are typically wafer terms, which are due to SDW 102. Similarly, in an embodiment wherein each unit 106 is an SDW 108, all or nearly all data in each cleaned test data set 134 is due to SDW 102 corresponding to cleaned test data set 134, but not due to a particular field 110. In such an embodiment, the NUSVs of step 130 are typically field terms, which are due to fields 110. In other words, test data set 122 contains contributions both from unit-specific terms, which contain information specific to unit 106, and non-unit specific terms, which may not contain information specific to unit 106.

For example, as seen particularly in FIGS. 2A & 2B, each test data set 122 is relatively complex, because each test data set 122 includes contributions both from SDW 102 and from field 110. After the NUSVs are removed from each test data set 122 at step 130, cleaned test data sets 134 are generated. As seen in the example illustrated in FIG. 2B, all or nearly all of cleaned test data set 134 represents contributions from field 110. It is appreciated that the number of cleaned test data sets 134 can be the same as the number of test data sets 122. For simplicity and ease of understanding, only a relatively few cleaned test data sets 134 are shown in FIG. 2B. Additionally, cleaned test data sets 134 typically include data in two dimensions; however, for simplicity and ease of understanding, cleaned test data sets 134 are shown for one dimension only.

In an embodiment of the present invention, the NUSVs of step 130 are modeled NUSVs, and are identified using a suitable model. Such a suitable model may include, inter alia, an average of test data sets, an adaptive model of test data sets, such as the adaptive model of the present invention, and a model similar to a model described in Dana Klein, Dania Negri, "Error modeling and accuracy breakdown in optical overlay metrology for advanced nodes," Proc. SPIE 11613, Optical Microlithography XXXIV, 116130X (22 Feb. 2021).

As seen particularly in FIG. 1A, at a next step 140, cleaned test data sets 134 are analyzed, thereby generating a fitting function for GSDW 104. It is appreciated that the fitting function may be expressed as a combination of multiple functions. In an instance, the analysis of step 140 includes vectorizing cleaned test data sets 134 and then generating the fitting function. When cleaned test data sets 134 are vectorized, data in cleaned test data sets 134 is split into orthogonal components. As is known in the art, orthogonal components may be expressed using any suitable basis having any suitable number of dimensions, such as, inter alia, x- and y-components or r- and theta- and phi-components.

In an instance, principal component analysis (PCA) is used to generate the fitting function. In an embodiment of the present invention, the analysis of step 140 includes both vectorizing cleaned test data sets 134 and performing PCA on cleaned test data sets 134.

In one embodiment of the present invention, after step 140, the method proceeds to a next step 150, at which misregistration data for SDW 102 is calculated. In an instance, calculating misregistration data at step 150 includes transforming a plurality of coefficient sets, which are generated together with the fitting function at step 140. The transformation of the coefficient sets at step 150 generates a plurality of transformed coefficient sets. The transformed coefficient sets can be directly related to a model other than that of the fitting function, such as a model designed to describe effects of a fabrication or metrology tool used in a manufacture of GSDW 104. Such a model may include, inter alia, a lithography scanner model, a deposition model, an etcher model, a polisher model and a misregistration metrology tool model.

It is appreciated that the coefficient sets generated at step 140 may be transformed multiple times at step 150, for example in order to generate multiple pluralities of transformed coefficient sets. Thus, the misregistration data calculated at step 150 may advantageously be directly related to a multiplicity of models. It is appreciated that any suitable number and types of plurality of transformed coefficient sets may be generated at step 150, thus allowing any suitable number and types of models to be readily analyzed.

In an embodiment wherein misregistration data is calculated for SDW 102, the misregistration data calculated at step 150 can be correlated with one or more fabrication or metrology tools used in the manufacture of GSDW 104. Typically, the misregistration data is correlated with a tool by projecting the fitting function weighted by the coefficient set generated at step 140 onto a model of the tool. Thus, it is appreciated that at least some of the fabrication or metrology tools with which misregistration data is correlated are tools having models that directly relate to the transformed coefficients generated at step 150.

The misregistration data calculated at step 150 can be any suitable misregistration data, including, inter alia, misregistration values between two or more layers formed on SDW 102, and/or tool-induced shift (TIS) values.

In an embodiment wherein the misregistration data calculated at step 150 includes TIS values, step 120 can include measuring at least some of the sites on SDW 102 at two different rotational orientations, for example as described in either or both of U.S. patent application Ser. No. 17/469,280 and Boaz Ophir, Udi Shusterman, Anna Golotsvan, Cindy Kato, Masanobu Hayashi, Richika Kato, Tomohiro Goto, Taketo Kuriyama, Manabu Miyake, Yasuki Takeuchi, Hiroyuki Mizuochi, "Machine learning for Tool Induced Shift (TIS) reduction: an HVM case study," Proc. SPIE 11611, Metrology, Inspection, and Process Control for Semiconductor Manufacturing XXXV, 116110E (22 Feb. 2021).

Then at step 130, TIS values are calculated, for example, using a method described in either or both of U.S. patent application Ser. No. 17/469,280 and Boaz Ophir, Udi Shusterman, Anna Golotsvan, Cindy Kato, Masanobu Hayashi, Richika Kato, Tomohiro Goto, Taketo Kuriyama, Manabu Miyake, Yasuki Takeuchi, Hiroyuki Mizuochi, "Machine learning for Tool Induced Shift (TIS) reduction: an HVM case study," Proc. SPIE 11611, Metrology, Inspection, and Process Control for Semiconductor Manufacturing XXXV, 116110E (22 Feb. 2021). The TIS values calculated at step 130 can be identified as the NUSVs and are removed from test data sets 122 at step 130, thereby generating cleaned test data sets 134.

In such an embodiment, the fitting function generated at step 140 is useful in calculating TIS values at step 150. In an embodiment of the present invention, the TIS values calculated at step 150 are removed from measurement data, and further calculations are performed to calculate misregistration values between two or more layers formed on SDW 102.

Alternatively, in an embodiment wherein the misregistration data calculated at step 150 includes TIS values, at step 120, at least some of the sites on SDW 102 are measured twice, once each at two different rotational orientations. Thereafter each of steps 130, 140 and 150 are performed separately for each of the rotational orientation measurements for each measurement site, thereby generating a separate misregistration value for each of the rotational orientation measurements for each site. The separate misregistration values are averaged together to generate an average misregistration value for the measurement sites. Then, for each measurement site, the difference between the misregistration value for each measurement site rotational orientation and the average misregistration value for that measurement site is identified at a TIS value for that measurement site. In an instance, the TIS value for each measurement site is removed from a misregistration value calculated for each measurement site.

In an embodiment of the present invention, some of the TIS values calculated using the method of the present invention are calibrated using an additional TIS calculation method, such as, inter alia, a method described in either or both of U.S. patent application Ser. No. 17/469,280 and Boaz Ophir, Udi Shusterman, Anna Golotsvan, Cindy Kato, Masanobu Hayashi, Richika Kato, Tomohiro Goto, Taketo Kuriyama, Manabu Miyake, Yasuki Takeuchi, Hiroyuki Mizuochi, "Machine learning for Tool Induced Shift (TIS) reduction: an HVM case study," Proc. SPIE 11611, Metrology, Inspection, and Process Control for Semiconductor Manufacturing XXXV, 116110E (22 Feb. 2021).

In an embodiment of the present invention, the method returns to step 100 and selects another SDW 102 to measure, and based thereon either refines the fitting function generated at step 140, or generates a new fitting function. For example, if GSDW 104 includes SDWs 108 that are fabricated in different months from one another, a first SDW may be selected in a first month, and a fitting function is generated therefrom. In a second month, a second SDW may be selected, and a fitting function is generated either based on the second SDW alone or on a combination of the second SDW and previous fitting functions, such as the fitting function generated based on the first SDW.

In an alternative embodiment of the present invention, the method proceeds directly from step 140 to a next step 160.

Turning now particularly to FIGS. 1B & 2A, at step 160 an additional SDW (ASDW) 162 is selected from GSDW 104, and a plurality of measurement sites on ASDW 162 are measured, thereby generating a plurality of run data sets. In an instance, each of the run data sets corresponds to at least one unit 106. It is a particular feature of the present invention that while the run data sets and test data sets 122 are generated from different SDWs 108, both SDW 102 and ASDW 162 are selected from a single GSDW 104, and can be measured using similar measurement techniques and measurement settings (e.g., using identical measurement techniques and measurement settings). Thus, the run data sets correspond to test data sets 122.

It is appreciated that ASDW 162 is an SDW 108 in GSDW 104, just as SDW 102 is an SDW 108 in GSDW 104. Thus, ASDW 162 includes features corresponding to features on SDW 102, including, inter alia, fields 110. It is further appreciated that SDW 102 is typically a test wafer, which is designated for more in-depth metrology measurements than are performed on other SDWs 108 of GSDW 104, such as ASDW 162.

In one embodiment of the present invention, test data sets 122 contain more information than do the run data sets. In another embodiment of the present invention, the amount of information contained in test data sets 122 and the run data sets is substantially the same. In both cases of the present invention, however, more computations are performed on test data sets 122 than are performed on the run data sets. Additionally, as described hereinbelow, results from computations performed on test data sets 122 can be used in the analysis of the run data sets.

At a next step 170, non-unit-specific values (NUSVs) are identified and removed from each of the run data sets generated at step 160, thereby generating a plurality of cleaned run data sets corresponding to the run data sets, and thus to test data sets 122. In an instance, all or nearly all data included in the cleaned run data sets is characteristic only of units 106.

It is appreciated that the type of unit 106 characterized by the cleaned run data set generated at step 170 is the same type of unit that is characterized by cleaned test data set 134. Thus, in an embodiment wherein all or nearly all data in each cleaned test data set 134 is due to a field 110, all or nearly all data in each of the cleaned run data sets generated at step 170 is due to a field 110. Similarly, in an embodiment wherein all or nearly all data in each cleaned test data set 134 is due to SDW 102, all or nearly all data in each of the cleaned run data sets generated at step 170 is due to ASDW 162.

In one embodiment of the present invention, the NUSVs of step 170 have the same values as those of the NUSVs of step 130. In another embodiment of the present invention, the NUSVs of step 170 have different values than those of the NUSVs of step 130. However, a single method can be used to identify both the NUSVs of step 130 and the NUSVs of step 170. Thus, in an embodiment wherein the NUSVs of step 130 are identified using an average of test data sets, the NUSVs of step 170 can be identified using an average of run data sets. Similarly, in an embodiment wherein the NUSVs of step 130 are identified using an advanced model of test data sets, the NUSVs of step 170 can be identified using the same advanced model of run data sets.

At a next step 180, each of the cleaned run data sets generated at step 170 is fit to the fitting function generated at step 140, thereby generating a plurality of coefficient sets. In an instance, one coefficient set is generated for each of the cleaned run data sets. It is appreciated that the coefficient sets generated at step 180 are directly related to the fitting function of the method of the present invention.

In an instance, calculations performed at step 180 include vectorizing the cleaned run data sets generated at step 170 and then generating the plurality of coefficient sets. When the cleaned run data sets are vectorized, data in the cleaned run data sets is split into orthogonal components. As is known in the art, orthogonal components may be expressed using any suitable basis having any suitable number of dimensions, such as, inter alia, x- and y-components or r- and theta- and phi-components.

Then, at a next step 190, the fitting function and the coefficient sets generated at step 180 are used to calculate misregistration data for ASDW 162. In one embodiment of the present invention, calculating misregistration data at step 190 includes transforming the plurality of coefficient sets generated at step 180, thereby generating a plurality of transformed coefficient sets. The transformed coefficient sets can be directly related to a model other than that of the fitting function, such as a model designed to describe effects of a fabrication or metrology tool used in the manufacture of GSDW 104. Such a model may include, inter alia, a lithography scanner model, a deposition model, an etcher model, a polisher model and a misregistration metrology tool model.

It is appreciated that the coefficient sets generated at step 180 may be transformed multiple times at step 190, for example in order to generate multiple pluralities of transformed coefficient sets. Thus, the misregistration data calculated at step 190 may advantageously be directly related to a multiplicity of models. It is appreciated that any suitable number and types of plurality of transformed coefficient sets may be generated at step 190, thus allowing any suitable number and types of models to be readily analyzed.

The misregistration data calculated at step 190 can be any suitable misregistration data, including, inter alia, misregistration values, such as misregistration between two or more layers formed on ASDW 162, and/or TIS values.

It is appreciated that in an embodiment wherein the misregistration data calculated at step 190 includes TIS values, the fitting function together with the coefficient sets calculated at step 180 can be used to calculate TIS values of ASDW 162, without measuring any measurement sites on ASDW 162 in multiple rotational orientations.

In an instance, at a next step 200, the misregistration data calculated at step 190 is correlated with one or more fabrication or metrology tools used in the manufacture of GSDW 104. Typically, the misregistration data is correlated with a tool by projecting the fitting function weighted by the coefficient set generated at step 180 onto a model of the tool. Therefore, at least some of the fabrication tools or metrology tools with which misregistration data is correlated at step 200 are tools having models that directly relate to the transformed coefficients generated at step 190.

Correlating misregistration data with one or more fabrication or metrology tools used in the manufacture of GSDW 104 provides information about a source of undesired misregistration. This can allow misregistration to either be corrected, such as by adjusting fabrication parameters, or disregarded, after being identified as an artifact.

In an embodiment wherein the misregistration data calculated at step 190 includes TIS values, as described hereinabove with reference to steps 120, 130, 140 and 150, TIS values calculated at step 150 are removed from the misregistration data generated at step 190.

At a next step 210, a decision is made whether or not to measure misregistration between at least two layers formed on a further ASDW 108 in GSDW 104. If misregistration of another ASDW 108 is to me measured, then the method selects another ASDW 108 and proceeds to step 160, at which the another ASDW 108 is measured and the method proceeds through steps 160, 170, 180, 190, 200 and 210. Otherwise, the method ends.

Figure 3:
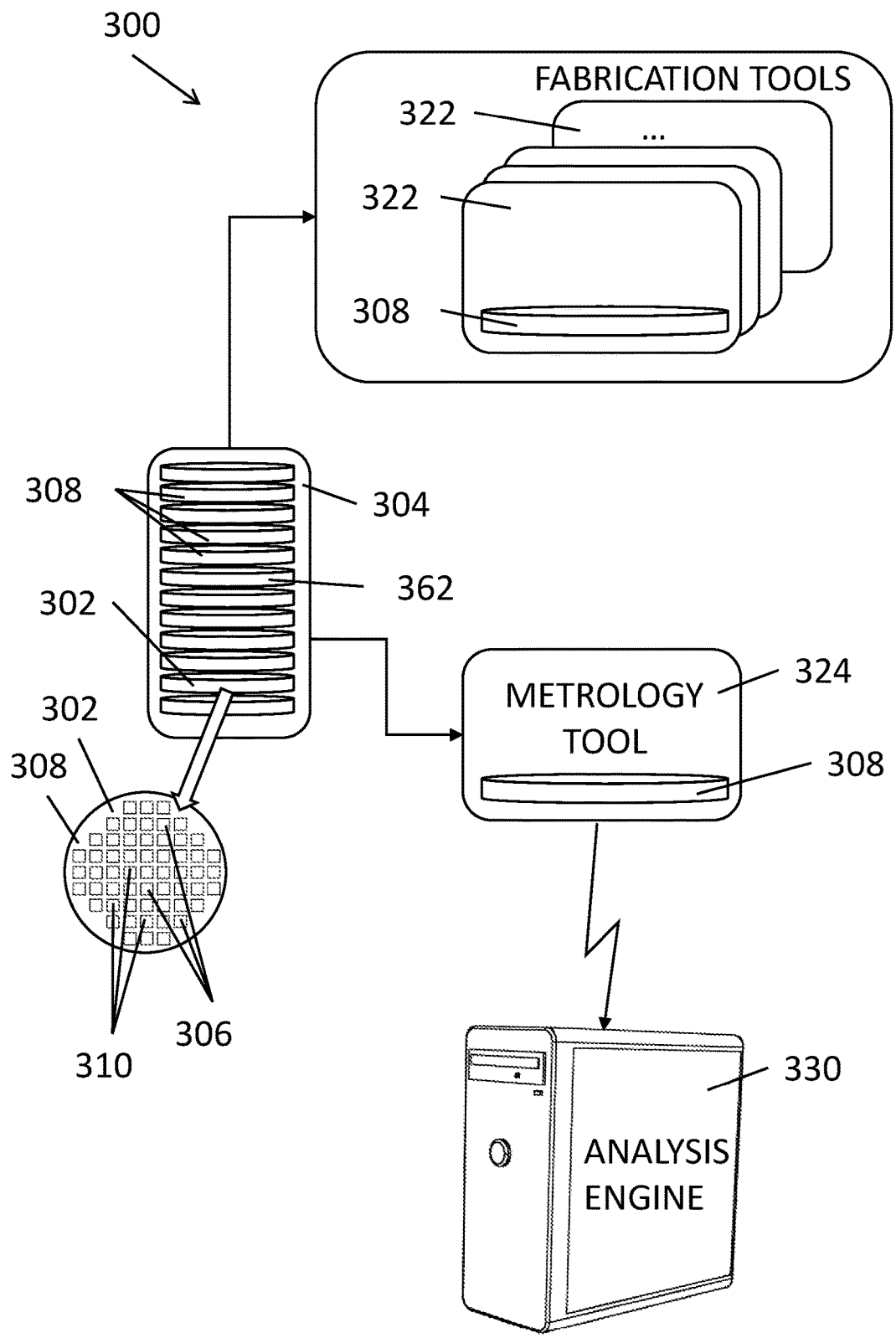
FIG. 3 is a simplified schematic illustration of an adaptive modeling misregistration measurement system useful in performing the method of FIGS. 1A-2B.

Reference is now made to FIG. 3, which is a simplified schematic illustration of an adaptive modeling misregistration measurement system 300 useful in performing the method of FIGS. 1A-2B.

System 300 can be used to fabricate at least one SDW 302, such as SDW 102 described hereinabove, and a GSDW 304 of which SDW 302 is a part, such as GSDW 104 described hereinabove. As described hereinabove, GSDW 304 includes a multiplicity of units 306, which may be embodied as any suitable component of SDW 302 or GSDW 304, such as, inter alia, a plurality of SDWs 308, a plurality of fields 310, a plurality of dies, a plurality of rows, a plurality of columns or a plurality of chips. GSDW 304 can include at least 50 units 306, and typically includes more than 50 units 306, such as, for example, hundreds of units 306 or thousands of units 306. SDW 302 or SDWs 302 can each be a test wafer designated for more in-depth metrology measurements than are performed on other SDWs 308 of GSDW 304. It is appreciated that SDW 308 may refer to any semiconductor device wafer in GSDW 304, including but not limited to SDW 302.

As seen in FIG. 3, system 300 can include multiple fabrications tools 322, such as any or all of, inter alia, a lithography scanner tool, a deposition tool, an etcher tool and a polisher tool. Additionally, system 300 can include a metrology tool 324, such as a misregistration metrology tool like an electron-beam misregistration metrology tool, an imaging misregistration metrology tool or a scatterometry misregistration metrology tool.

Fabrication tools 322 can be used in the fabrication of SDWs 308 in GSDW 304, for example in the formation of layers on SDWs 308, the patterning of layers on SDWs 308 and the polishing of SDWs 308. Metrology tool 324 can be used at various stages of the fabrication of GSDW 304 to measure misregistration between two or more layers formed on an SDW 308.

As described hereinabove, upon measuring a plurality of measurement sites on an SDW 308, metrology tool 324 generates a plurality of data sets, each of which can correspond to one unit 306. In a case wherein metrology tool 324 measures SDW 302, metrology tool 324 generates test data sets. In a case wherein metrology tool 324 measures a wafer from GSDW 304 other than SDW 302, metrology tool 324 generates run data sets.

In one embodiment of the present invention, the test data sets contain more information than do the run data sets. In another embodiment of the present invention, the amount of information contained in the test data sets and the run data sets is substantially the same. In both cases of the present invention, however, more computations are performed on the test data sets than are performed on the run data sets. Additionally, as described hereinabove with reference to FIGS. 1A-2B, results from computations performed on the test data sets can be used in the analysis of the run data sets.

System 300 can further include an analysis engine 330. It is appreciated that while analysis engine 330 is shown in FIG. 3 as being separate from metrology tool 324, in an embodiment of the present invention, analysis engine 330 is integrated into metrology tool 324. Similarly, analysis engine 330 may form part of a computing system other than that of metrology tool 324. Additionally, analysis engine 330 may include multiple portions, some of which may be separate from one another. For example, one portion of analysis engine may be housed in metrology tool 324 while another portion of analysis engine 330 is a standalone device.

Analysis engine 330 typically comprises or uses a programmable processor, which is programmed in software and/or firmware to carry out the functions that are described herein, along with suitable digital and/or analog interfaces for connection to the other elements of system 300. Alternatively or additionally, the analysis engine 330 comprises or uses hard-wired and/or programmable hardware logic circuits, which carry out at least some of the functions of the analysis engine 330. Although the analysis engine 330 is shown, for the sake of simplicity, as a single system, in practice the analysis engine 330 may comprise multiple, interconnected control units, with suitable interfaces for receiving and outputting the signals that are illustrated in the figures and are described in the text. Program code or instructions for the analysis engine 330 to implement various methods and functions disclosed herein may be stored in readable storage media, such as a memory in the system or other memory.

In an instance, analysis engine 330 is operative to identify and remove NUSVs from data sets generated by metrology tool 324, thereby generating a plurality of cleaned data sets corresponding to the plurality of data sets. In an instance, all or nearly all data included in each of the cleaned test data sets is characteristic only of a unit 306.

Thus, in an embodiment wherein each unit 306 is a field 310, all or nearly all data in each cleaned data set is due to the field 310 corresponding to the cleaned data set, but not due to SDW 308. In such an embodiment, the NUSVs identified by analysis engine 330 are typically wafer terms, which are due to SDW 308.

Similarly, in an embodiment wherein each unit 306 is an SDW 308, all or nearly all data in each cleaned data set is due to SDW 308 corresponding to the cleaned data set, but not due to a particular field 310. In such an embodiment, the NUSVs identified by analysis engine 330 are typically field terms, which are due to fields 310.

In other words, the data set contains contributions both from unit-specific terms, which contain information specific to unit 306, and non-unit specific terms, which may not contain information specific to unit 306.

In an embodiment of the present invention, the NUSVs identified by analysis engine 330 are modeled NUSVs, and are identified using a suitable model. Such a suitable model may include, inter alia, an average of test data sets, an adaptive model of test data sets, such as the adaptive model of the present invention, and a model similar to a model described in Dana Klein, Dania Negri, "Error modeling and accuracy breakdown in optical overlay metrology for advanced nodes," Proc. SPIE 11613, Optical Microlithography XXXIV, 116130X (22 Feb. 2021).

As described hereinabove with particular reference to FIG. 1A, analysis engine 330 can additionally analyze the cleaned test data sets, thereby generating both a fitting function and a plurality of coefficient sets for GSDW 304.

In one embodiment of the present invention, analysis engine 330 uses the fitting function and the coefficient sets in the calculation of misregistration data, such as misregistration between two or more layers formed on an SDW 308, and/or TIS values.

In another embodiment of the present invention, analysis engine 330 communicates the fitting function and the coefficient sets either to a human user or to a machine operative to calculate misregistration data, such as misregistration between two or more layers formed on an SDW 308 and/or TIS values, and then the fitting function and the coefficient sets are used in the calculation of the misregistration data.

As described hereinabove, calculating misregistration data includes transforming the coefficient sets, thereby generating a plurality of transformed coefficient sets. The transformed coefficient sets can be directly related to a model other than that of the fitting function, such as a model designed to describe effects of one of fabrication tools 322 metrology tool 324 used in the manufacture of GSDW 304. Such a model may include, inter alia, a lithography scanner model, a deposition model, an etcher model, a polisher model and a misregistration metrology tool model.

It is appreciated that the coefficient sets may be transformed multiple times, such as by analysis engine 330, but alternatively by any suitable machine or human calculator, for example in order to generate multiple pluralities of transformed coefficient sets. Thus, the misregistration data calculated may advantageously be directly related to a multiplicity of models. Each of the multiplicity of models can be related to one of, or in some embodiments multiple ones of, fabrication tools 322 and metrology tool 324 used in the manufacture of GSDW 304. It is appreciated that any suitable number and types of plurality of transformed coefficient sets may be generated, thus allowing any suitable number and types of models to be readily analyzed.

As described hereinabove, the misregistration data is typically correlated with a particular fabrication tool 322 or metrology tool 324 by projecting the fitting function weighted by the coefficient set generated by analysis engine 330 onto a model of the fabrication tool 322 or metrology tool 324.

In an embodiment wherein the misregistration data includes TIS values, the TIS values can be identified as the NUSVs and are removed from the data sets, thereby generating the cleaned data sets. In such an embodiment, the fitting function generated by analysis engine 330 is useful in calculating TIS values. In an embodiment of the present invention, the TIS values are removed from measurement data, and further calculations are performed to calculate misregistration values between two or more layers formed on an SDW 308.

As described hereinabove, typically not all SDWs 308 in GSDW 304 are test wafers such as SDW 302. SDWs 308 in GSDW 304 which are not test wafers such as SDW 302 are referred to herein as ASDWs. Metrology tool 324 can measure a plurality of measurement sites on an ASDW 362, thereby generating a plurality of run data sets. In an instance, each of the run data sets corresponds to at least one unit 306.

As described hereinabove, it is a particular feature of the present invention that while the run data sets and the test data sets are generated from different SDWs 308, both SDW 302 and ASDW 362 are selected from a single GSDW 304, and can be measured using similar measurement techniques and measurement settings (e.g., using identical measurement techniques and measurement settings). Thus, the run data sets correspond to the test data sets.

In an instance, analysis engine 330 identifies and removes NUSVs from each of the run data sets, thereby generating a plurality of cleaned run data sets corresponding to the run data sets, and thus to the test data sets. In an instance, all or nearly all data included in the cleaned run data sets is characteristic only of unit 306.

In an embodiment of the present invention, analysis engine 330 fits each of the cleaned run data to the fitting function generated by analysis engine 330 from test run data, thereby generating a plurality of coefficient sets. In an instance, one coefficient set is generated for each of the cleaned run data sets. It is appreciated that the coefficient sets generated by analysis engine 330 are directly related to the fitting function generated by analysis engine 330.

In one embodiment of the present invention, analysis engine 330 uses the fitting function and the coefficient sets in the calculation of misregistration data, such as misregistration between two or more layers formed on ASDW 362, and/or TIS values.

In another embodiment of the present invention, analysis engine 330 communicates the fitting function and the coefficient sets either to a human user or to a machine operative to calculate misregistration data, such as misregistration between two or more layers formed on an ASDW 362 and/or TIS values, and then the fitting function and the coefficient sets are used in the calculation of the misregistration data.

As described hereinabove, calculating misregistration data includes transforming the coefficient sets, thereby generating a plurality of transformed coefficient sets. The transformed coefficient sets can be directly related to a model other than that of the fitting function, such as a model designed to describe effects of one of fabrication tools 322 or metrology tool 324 used in the manufacture of GSDW 304. Such a model may include, inter alia, a lithography scanner model, a deposition model, an etcher model, a polisher model and a misregistration metrology tool model.

It is appreciated that the coefficient sets may be transformed multiple times, such as by analysis engine 330, but alternatively by any suitable machine calculator, for example in order to generate multiple pluralities of transformed coefficient sets. Thus, the misregistration data calculated may advantageously be directly related to a multiplicity of models. Each of the multiplicity of models can be related to one of, or in some embodiments multiple ones of, fabrication tools 322 and metrology tool 324 used in the manufacture of GSDW 304. It is appreciated that any suitable number and types of plurality of transformed coefficient sets may be generated, thus allowing any suitable number and types of models to be readily analyzed.

As described hereinabove, the misregistration data is typically correlated with a particular fabrication tool 322 or metrology tool 324 by projecting the fitting function weighted by the coefficient set generated by analysis engine 330 on a model of the fabrication tool 322 or metrology tool 324.

In an embodiment wherein the misregistration data includes TIS values, the TIS values can be identified as the NUSVs and are removed from the data sets, thereby generating the cleaned data sets. In such an embodiment, the fitting function generated by analysis engine 330 is useful in calculating TIS values. In an embodiment of the present invention, the TIS values are removed from measurement data, and further calculations are performed to calculate misregistration values between two or more layers formed on ASDW 362.

In an instance, the misregistration data calculated for ASDW 362 is correlated with one or more of fabrication tools 322 and metrology tool 324 used in the manufacture of GSDW 304. Typically, the misregistration data is correlated with a fabrication tool 322 or metrology tool 324 by projecting the fitting function weighted by the coefficient set generated by analysis engine 330 on a model of the fabrication tool 322 or metrology tool 324. Therefore, at least some of fabrication tools 322 and metrology tool 324 with which misregistration data is correlated are tools having models that are directly related to the transformed coefficients generated by analysis engine 330.

Correlating misregistration data with one or more of fabrication tools 322 and metrology tool 324 used in the manufacture of GSDW 304 provides information about a source of undesired misregistration. This can allow misregistration to either be corrected, such as by adjusting fabrication parameters, or disregarded, after being identified as an artifact.

It will be appreciated by persons skilled in the art that the present invention is not limited to what has been particularly shown and described hereinabove. The scope of the present invention includes both combinations and subcombinations of various features described hereinabove as well as modifications thereof, all of which are not in the prior art.

The invention claimed is:

1. An adaptive modeling method for generating misregistration data between at least two layers formed on a semiconductor device wafer (SDW), the method comprising:

calculating a fitting function for a group of said SDWs (GSDW) using an analysis engine, said GSDW comprising a plurality of units, said calculating said fitting function comprising:
measuring a plurality of measurement sites on at least one SDW in said GSDW using a metrology tool, thereby generating a plurality of test data sets, each of said test data sets corresponding to at least one of said units, wherein said metrology tool comprises an electron-beam misregistration metrology tool, an imaging misregistration metrology tool, or a scatterometry misregistration metrology tool, and wherein said test data sets each include data in at least one dimension;
removing non-unit-specific values (NUSVs) from each of said plurality of test data sets, thereby generating a corresponding plurality of cleaned test data sets; and
analyzing said cleaned test data sets, thereby generating said fitting function for said GSDW; and generating misregistration data for at least one additional SDW (ASDW) in said GSDW, said generating misregistration data comprising:
measuring a plurality of measurement sites on said ASDW, thereby generating a plurality of run data sets, said run data sets corresponding to said test data sets;
removing NUSVs from each of said plurality of run data sets, thereby generating a corresponding plurality of cleaned run data sets;

fitting each of said cleaned run data sets to said fitting function, thereby generating a plurality of coefficient sets corresponding to said plurality of cleaned run data sets; and calculating misregistration data for said ASDW, at least partially based on said fitting function and said plurality of coefficient sets.

2. The method according to claim 1, wherein said analyzing said cleaned test data sets comprises performing principal component analysis (PCA) on said plurality of cleaned test data sets.

3. The method according to claim 1, wherein each of said units comprises a single field on said SDW.

4. The method according to claim 3 and wherein said NUSVs are wafer terms.

5. The method according to claim 1, wherein each of said units comprises a multiplicity of fields on said SDW.

6. The method according to claim 5 and wherein said NUSVs are field terms.

7. The method according to claim 1, wherein said misregistration data comprises tool-induced-shift (TIS) values or misregistration values.

8. The method according to claim 1, wherein said NUSVs are modeled NUSVs.

9. The method according to claim 1, further comprising correlating said misregistration data with at least one tool used in a manufacture of said GSDW.

10. The method according to claim 9, further comprising correlating said misregistration data with at least one additional tool used in said manufacture of said GSDW.

11. The method according to claim 1, wherein said calculating misregistration data for said ASDW comprises transforming said plurality of coefficient sets, thereby generating a plurality of transformed coefficient sets.

12. The method according to claim 11, wherein said plurality of transformed coefficient sets correspond to a model other than said fitting function.

13. The method according to claim 12, wherein said model comprises one of:
a lithography scanner model;
a deposition model;
an etcher model;
a polisher model; or
a misregistration metrology tool model.

14. The method according to claim 1, further comprising adjusting fabrication parameters of said GSDW based on said misregistration data.

15. An adaptive modeling system for generating misregistration data between at least two layers formed on a semiconductor device wafer (SDW), the system comprising:
one or more fabrication tools used in a manufacture of at least two layers formed on an SDW, each SDW being part of a group of SDWs (GSDW), said GSDW comprising a plurality of units;
a metrology tool, used to measure a plurality of measurement sites on at least one SDW in said GSDW, thereby generating a plurality of test data sets, each of said test data sets corresponding to at least one of said units, wherein said metrology tool comprises an electron-beam misregistration metrology tool, an imaging misregistration metrology tool, or a scatterometry misregistration metrology tool, wherein said test data sets each include data in at least one dimension, and wherein said metrology tool also measures a plurality of measurement sites on said ASDW, thereby generating a plurality of run data sets, said run data sets corresponding to said test data sets; and
an analysis engine operative to calculate a fitting function for said GSDW, said calculating said fitting function comprising:
removing non-unit-specific values (NUSVs) from each of said plurality of test data sets, thereby generating a corresponding plurality of cleaned test data sets; and
analyzing said cleaned test data sets, thereby generating said fitting function for said GSDW;
said analysis engine is further operative to generate misregistration data for at least one additional SDW (ASDW) in said GSDW, said generating misregistration data comprising:
removing NUSVs from each of said plurality of run data sets, thereby generating a corresponding plurality of cleaned run data sets;
fitting each of said cleaned run data sets to said fitting function, thereby generating a plurality of coefficient sets corresponding to said plurality of cleaned run data sets; and
calculating misregistration data for said ASDW, at least partially based on said fitting function and said plurality of coefficient sets.

16. The system according to claim 15, wherein said one or more fabrication tools comprises at least one of:
a lithography scanner tool;
a deposition tool;
an etcher tool; or
a polisher tool.

17. The system according to claim 15, wherein each of said units comprises a single field on said SDW.

18. The system according claim 15, wherein each of said units comprises data a multiplicity of fields on said SDW.

19. The system according to claim 15, wherein said misregistration data comprises tool-induced-shift (TIS) values.

20. The system according to claim 15, wherein said misregistration data comprises misregistration values.

21. The system according to claim 15, wherein said analysis engine also correlates said misregistration data with at least one of said one or more fabrication tools and said metrology tool.

22. The system according to claim 21, wherein said analysis engine also correlates said misregistration data with at least one additional one of said one or more fabrication tools and said metrology tool.

* * * * *